(12) United States Patent
Tierno

(10) Patent No.: US 8,675,722 B2
(45) Date of Patent: Mar. 18, 2014

(54) METHODS AND APPARATUS FOR SNAPSHOT-BASED EQUALIZATION OF A COMMUNICATIONS CHANNEL

(75) Inventor: Jose A. Tierno, Stamford, CT (US)

(73) Assignee: International Business Machines Corporation, Armonk, NY (US)

( * ) Notice: Subject to any disclaimer, the term of this patent is extended or adjusted under 35 U.S.C. 154(b) by 1615 days.

(21) Appl. No.: 10/668,562

(22) Filed: Sep. 23, 2003

(65) Prior Publication Data

US 2005/0074058 A1    Apr. 7, 2005

(51) Int. Cl.
*H03K 5/159*    (2006.01)

(52) U.S. Cl.
USPC ........... 375/229; 375/232; 375/234; 375/316; 375/346; 375/348; 708/323

(58) Field of Classification Search
USPC ......... 375/229, 316, 354, 232, 234, 346, 348; 708/323
See application file for complete search history.

(56) References Cited

U.S. PATENT DOCUMENTS

| | | | |
|---|---|---|---|
| 5,222,101 A * | 6/1993 | Ariyavisitakul et al. ..... | 375/231 |
| 5,260,836 A * | 11/1993 | Yada et al. ...................... | 360/32 |
| 6,570,944 B2 * | 5/2003 | Best et al. ...................... | 375/355 |
| 6,885,828 B1 * | 4/2005 | Cornelius ...................... | 398/209 |
| 7,075,363 B1 * | 7/2006 | Thon .............................. | 327/552 |
| 2003/0086339 A1 * | 5/2003 | Dally et al. ..................... | 368/202 |
| 2003/0154416 A1 * | 8/2003 | LaBerge ........................ | 713/400 |
| 2004/0062329 A1 * | 4/2004 | Hsu et al. ...................... | 375/355 |
| 2004/0243258 A1 * | 12/2004 | Shattil ............................ | 700/73 |

OTHER PUBLICATIONS

Shahid U.H. Qureshi, "Adaptive Equalization," Proceedings of the IEEE, vol. 73, No. 9, pp. 1349-1387, Sep. 1985.
B. Widrow et al., "The LMS Algorithm," Adaptive Algorithms and Structure, Prentice-Hall, Inc., Chapter 6, Part III, pp. 99-116, 1985.

* cited by examiner

*Primary Examiner* — Leila Malek
(74) *Attorney, Agent, or Firm* — Anne Dougherty; Ryan, Mason & Lewis, LLP

(57) ABSTRACT

Equalization techniques for compensating distortion associated with a communications channel are provided. In one aspect of the invention, a method/apparatus for equalizing an input signal received from a communications channel includes the following steps/operations. At least one sampling is generated from the received input signal based on a clock signal unrelated to a clock signal used to recover data associated with the received input signal. Distortion associated with the communications channel is then compensated for based on at least a portion of the at least one generated sampling.

15 Claims, 4 Drawing Sheets

METHODS AND APPARATUS FOR SNAPSHOT-BASED EQUALIZATION OF A COMMUNICATIONS CHANNEL

FIELD OF THE INVENTION

The present invention relates generally to data channel receivers in the field of digital communications and, more particularly, to methods and apparatus for compensating for distortion associated with a digital communications channel.

BACKGROUND OF THE INVENTION

Receive side equalization is a technique by which a signal received on a communications channel is modified to cancel out the distortion caused by the channel. There are many devices that can be used to equalize a signal, for example, finite impulse response (FIR) filters, decision feedback equalizers (DFE), peaking amplifiers, etc.

Equalizers have a number of parameters that are adapted to the channel to cancel as much distortion as possible. Two different sets of techniques exist to compute those parameters: (i) blind equalization; and (ii) adaptive equalization.

With blind equalization, the channel is carefully measured, and the optimal parameters are computed off-line, and then programmed into the equalizer. This technique allows the use of sophisticated mathematical tools to compute the parameters, but fails when the channel has time varying characteristics, or when production numbers are so large that individual measurement of each channel becomes impractical.

With adaptive equalization, the receiver circuitry measures characteristics of the channel together with detecting the data, and computes and applies the parameters of the equalizer, often in a closed loop. This technique allows to compensate for time varying channels, or channels with a large number of manufacturing variations. On the other hand, only primitive channel measurements and simple computations can be performed with the available hardware resources.

SUMMARY OF THE INVENTION

The present invention provides equalization techniques for compensating distortion associated with a communications channel.

In one aspect of the invention, a method/apparatus for equalizing an input signal received from a communications channel includes the following steps/operations. At least one sampling is generated from the received input signal based on a clock signal unrelated to a clock signal used to recover data associated with the received input signal. Distortion associated with the communications channel is then compensated for based on at least a portion of the at least one generated sampling.

The sampling generation step/operation may further include generating multiple phases of the sampling clock signal, and sampling the received input signal at the respective multiple phases of the sampling clock signal to generate respective multiple samples. The distortion compensating step/operation may further include setting one or more parameter values based on the at least a portion of the at least one generated sampling, and applying the one or more parameter values to the received input signal. The sampling clock signal may have a lower frequency than the data recovery clock signal.

Further, the sampling generation step/operation may further include validating the at least one generated sampling. The validating step/operation may further include comparing samples of the at least one generated sampling a validation threshold. In another embodiment, the validating step/operation may further include generating leading edge samples and trailing edge samples from the received input signal, and varying an eye center threshold to determine the validity of the at least one generated sampling. The validating step/operation may further include discarding samples of the at least one generated sampling that are determined to be invalid.

Still further, the communications channel may be a digital communications channel. Equalization may be performed in accordance with a data receiver coupled to the communications channel.

In another aspect of the invention, an equalization system, responsive to an input signal received from a communications channel, includes a sampling module. The sampling module generates at least one sampling from the received input signal based on a clock signal unrelated to a clock signal used to recover data associated with the received input signal. The equalization system also includes a filter. The filter compensates for distortion associated with the communications channel based on an equalization algorithm which is responsive to at least a portion of the at least one sampling generated by the sampling module. The equalization system is part of a data receiver. The equalization system is independent of a clock and data recovery system of the data receiver.

Thus, in accordance with the present invention, equalization of a digital communications channel uses snapshots associated with the channel to compensate for distortion. Further, equalization of a digital communications channel may be performed without performing clock and data recovery on the channel, since equalization according to the invention does not rely on exact timing information of the channel.

These and other objects, features and advantages of the present invention will become apparent from the following detailed description of illustrative embodiments thereof, which is to be read in connection with the accompanying drawings.

DETAILED DESCRIPTION OF PREFERRED EMBODIMENTS

Before describing illustrative implementations of a snapshot-based equalization system of the present invention, some existing equalization techniques will be described.

Figure 1:
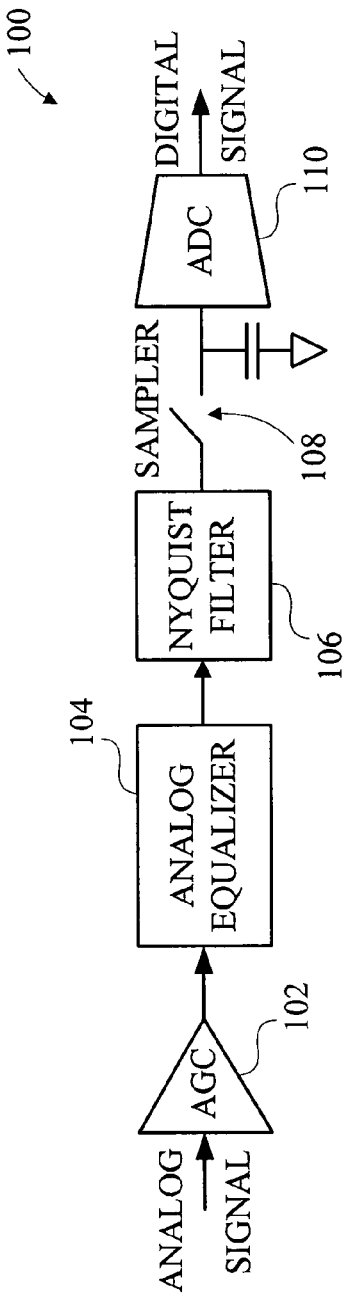
FIG. 1 is a diagram illustrating continuous time analog equalization.

Referring initially to FIG. 1, an equalization portion 100 of a receiver is shown. The equalization technique employed in FIG. 1 is continuous time analog equalization. Such a technique is performed on a received analog signal in accordance with an automatic gain control (AGC) amplifier 102, an analog equalizer 104, a Nyquist filter 106, a sampler 108 and an analog-to-digital converter (ADC) 110. As is evident, equalization is performed on the analog signal prior to sampling and digital conversion, and is thus considered continuous time analog equalization.

Figure 2:
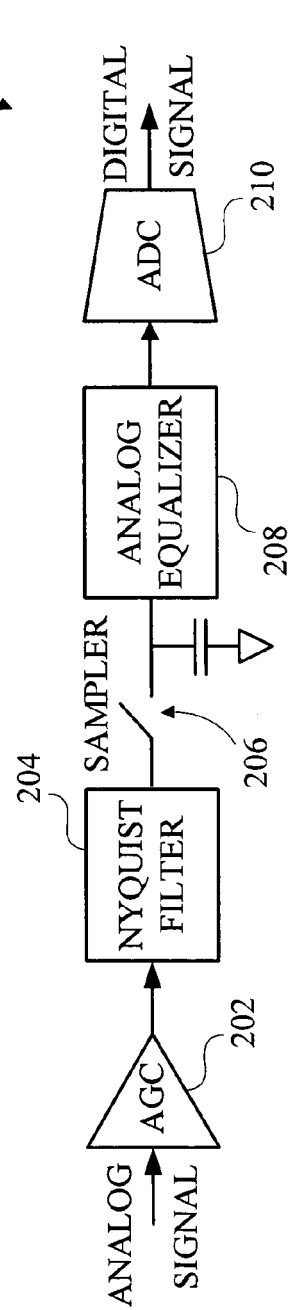
FIG. 2 is a diagram illustrating discrete time analog equalization.

Referring now to FIG. 2, an equalization portion 200 of a receiver is shown. The equalization technique employed in FIG. 2 is discrete time analog equalization. Such a technique is performed on a received analog signal in accordance with an AGC amplifier 202, a Nyquist filter 204, a sampler 206, an analog equalizer 208 and an ADC 210. As is evident, equalization is performed on the analog signal prior to digital conversion but after sampling, and is thus considered discrete time analog equalization.

Figure 3:
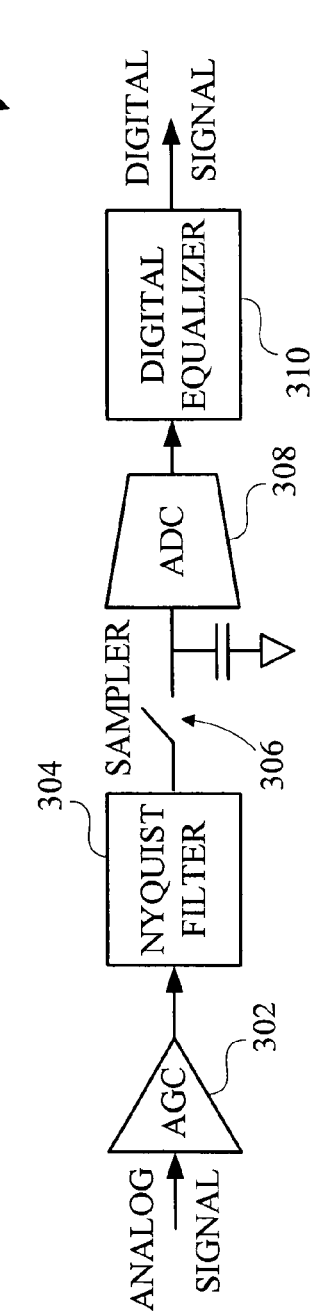
FIG. 3 is a diagram illustrating discrete time digital equalization.

Referring now to FIG. 3, an equalization portion 300 of a receiver is shown. The equalization technique employed in FIG. 3 is discrete time digital equalization. Such a technique is performed on a received analog signal in accordance with an AGC amplifier 302, a Nyquist filter 304, a sampler 306, an ADC 308 and a digital equalizer 310. As is evident, equalization is performed on the analog signal after sampling and digital conversion, and is thus considered discrete time digital equalization.

As will be explained in illustrative detail below, the present invention provides techniques for performing adaptive equalization by taking a "snapshot" in time of the input signal. The term "snapshot" as used herein generally refers to a sampling (e.g., set of one or more samples) of the input signal. The snapshot or sampling is taken with a low-frequency clock that is unrelated to the data clock. The "low-frequency" associated with the sampling clock is relative to the frequency of the data clock. By way of example, the frequency of the sampling clock used to take the snapshot may be 107 Megahertz (MHz), while the frequency of the data clock may be 1 Gigahertz (GHz).

It is to be appreciated that the snapshot may fail to capture a complete pulse much of the time. However, because the sampling clock and the data clock are unrelated, the snapshot will be successful on occasion (e.g., one time out of four for random data). Thus, a technique for evaluating the validity of the snapshot is also provided. Invalid snapshots (or samples associated therewith) are discarded, and valid snapshots (or samples associated therewith) are passed on to an automatic equalization algorithm.

Figure 4:
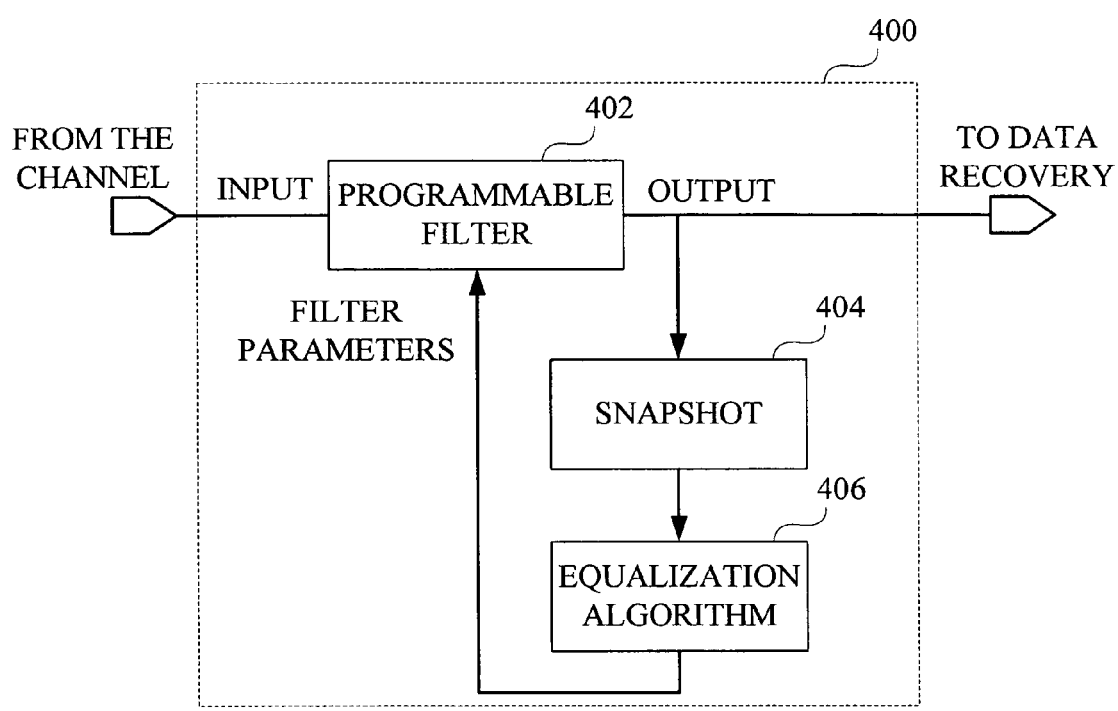
FIG. 4 is a diagram illustrating a snapshot-based equalization system according to an embodiment of the present invention.

Referring now to FIG. 4, a diagram illustrates a snapshot-based equalization system according to an embodiment of the present invention. As shown, equalization system 400 includes a programmable filter 402, a snapshot module 404 and an equalization algorithm 406.

Equalization system 400 receives an input signal from the data communications channel (not shown). The input signal is provided to programmable filter 402 whose filtering characteristics are set by filter parameters. The values for the filter parameters, as will be explained, are provided by equalization algorithm 406. The filtering characteristics of filter 402 are adaptively set such that distortion associated with the communications channel is compensated for, i.e., canceled or, at least, substantially canceled. That is, the input signal is modified by programmable filter 402, based on the filter parameters calculated by equalization algorithm 406, to compensate for channel distortion.

For example, if filter 402 is a linear continuous time amplifier, the parameters could be the location in the complex plane of its poles and zeros. A one Gigabit/second (Gbit/sec) signal that has a strong channel attenuation at 300 Megahertz (MHz), will require a filter that enhances the signal at 300 MHz, and attenuates the signal beyond 600 MHz. The 300 MHz enhancement flattens the frequency response of the channel, while the attenuation at 600 MHz and up improves the noise characteristic of the channel.

Snapshot module 404 samples the output of programmable filter 402, based on a clock (low-frequency sampling clock) that is unrelated to (e.g., independent of) the clock used to recover data, and provides a snapshot of the input signal to equalization algorithm 406 such that the algorithm can adapt the filter parameters, based on the snapshot, so as to compensate for distortion in the input signal caused by the channel.

The adaptive loop of sampling the input signal (via snapshot module 404), adjusting the filter parameter values (via equalization algorithm 406) and applying the filtering parameter values (via programmable filter 402) to modify the input signal may continue until distortion in the input signal equals or falls below some maximum acceptable distortion threshold value.

For example, the distortion is usually defined as the closing of the eye of the received signal due to the characteristics of the channel (and not because of noise in the channel). It is measured as a ratio of the amount of eye closure to the size of the full eye, and typically expressed in decibels (dB). Depending on the amount of noise present in the channel, and the desired maximum bit error rate, a distortion threshold value of less than 0.6 dB may be acceptable.

It is to be appreciated that equalization algorithm 406 may implement any known and appropriate equalization methodology, for example, a least mean squares algorithm, a gradient descent algorithm, a recursive least mean squares algorithm. See Shahid Qureshi, "Adaptive Equalization," Proceedings of the IEEE, vol. 73, no. 9, September 1985, pp. 1349-1387, the disclosure of which is incorporated by reference herein, for a description of various equalization algorithms that may be employed. Of course, the invention is not intended to be limited to any particular equalization algorithm.

Thus, given the particular equalization algorithm and the compensation mechanism (e.g., programmable filter) used, one of ordinary skill in the art will readily realize how the particular equalization algorithm generates the compensation parameters used to equalize the input signal, based on the set of samples (snapshot) generated according to the invention.

Figure 5:
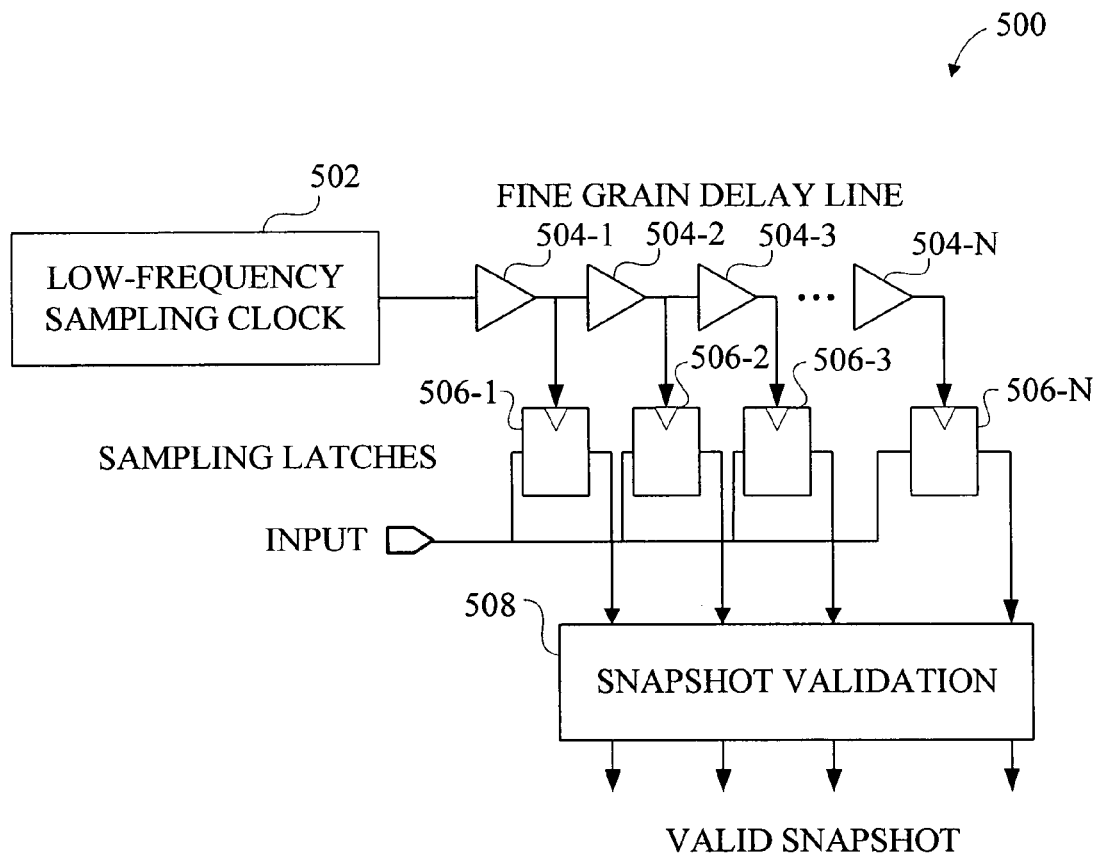
FIG. 5 is a diagram illustrating a snapshot module according to an embodiment of the present invention.

Referring now to FIG. 5, a diagram illustrates a snapshot module according to an embodiment of the present invention. Snapshot module 500 can be considered an illustrative implementation of snapshot module 404 of FIG. 4. As shown, snapshot module 500 may include a low-frequency sampling clock 502, a set of delay elements 504-1 through 504-N (where N is an integer representing the number of samples that make up the snapshot or sampling) forming a fine grain delay line, sampling latches 506-1 through 506-N, and a snapshot verification module 508.

The delay line formed by delay elements 504-1 through 504-N receives the low-frequency sampling clock 502 and generates multiple phases of the sampling clock spaced by a small fraction of one bit time period (e.g., one-tenth of a bit time period, depending on the characteristics of the system). For example, for a one GHz signal, the bit period would be one nanosecond (nsec), while the sampling period would be 100 picoseconds (psec).

The (buffered) input signal is then sampled N times within one bit time period, via sample latches 506-1 through 506-N, at the respective phases associated with the delay elements. These samples can be simple binary samples. These samples give a general idea of the shape of the pulse, wherein a more accurate representation of the pulse may come from integration of multiple snapshots.

The snapshot (samples) taken is provided to snapshot validation module 508 where the samples are validated. Invalid samples are discarded, and valid samples are passed on to equalization algorithm 406 (FIG. 4). The validity of the samples may be determined in a number of ways. In one embodiment, the samples can be compared against zero or an appropriate validation threshold. For typical signal values, the threshold may be a value between 100-300 millivolts (mV). Further, validation of the snapshot can be derived from the existence of transitions both at the beginning and the end of the snapshot. This is illustrated in FIG. 6.

Figure 6:
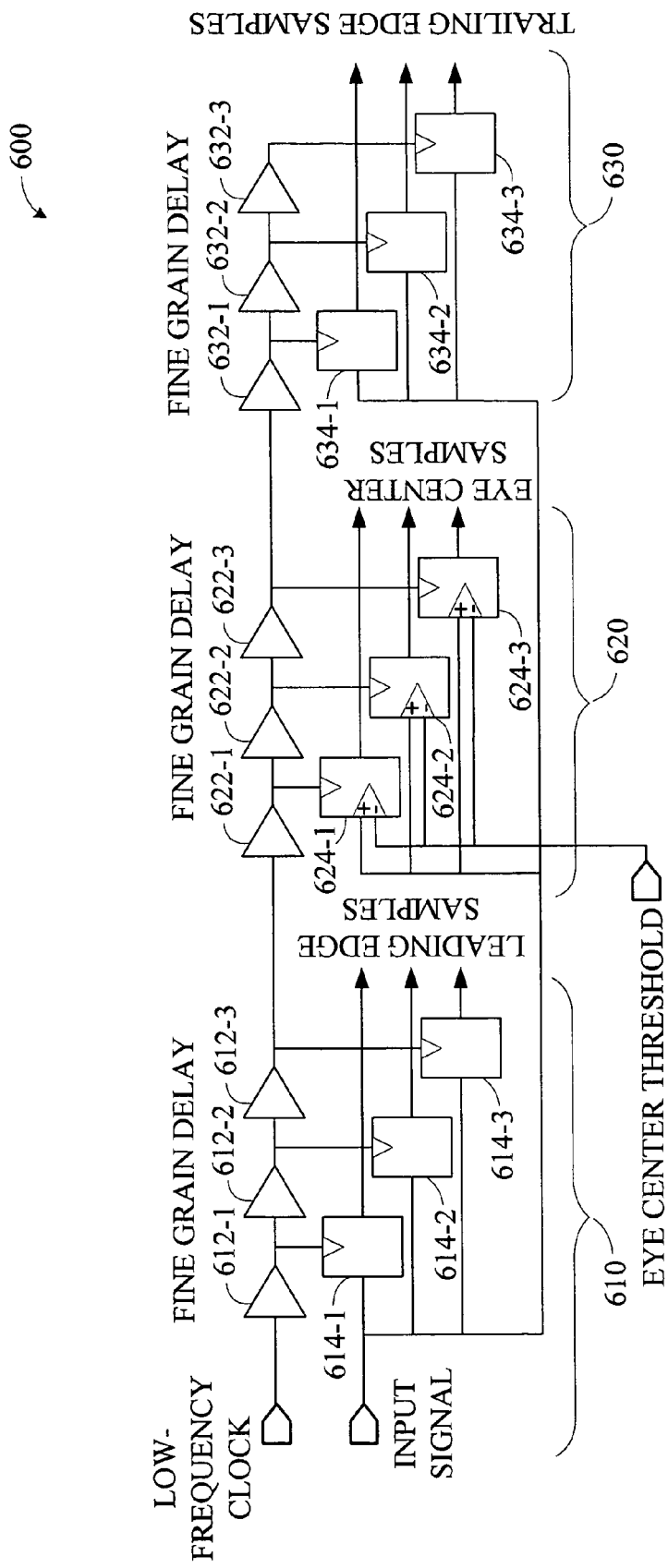
FIG. 6 is a diagram illustrating a snapshot module according to another embodiment of the present invention.

Referring now to FIG. 6, a diagram illustrates a snapshot module according to another embodiment of the present invention. More particularly, FIG. 6 shows how a set of sampling latches can be used to locate the leading edge of a pulse, a second set to locate the trailing edge of a pulse, and a third set in the center can be used to sample the actual pulse.

That is, as shown, snapshot module 600 includes blocks 610, 620 and 630. Snapshot module 600 can be considered an illustrative implementation of snapshot module 404 of FIG. 4. Each block contains delay elements (612-1 through 612-3 in block 610, 622-1 through 622-3 in block 620, and 632-1 through 632-3 in block 630) and sampling latches (614-1 through 614-3 in block 610, 624-1 through 624-3 in block 620, and 634-1 through 634-3 in block 630). The delay elements and latches operate in the same manner as described above with respect to FIG. 5. While N is equal to three in FIG. 6, the invention is not so limited.

In accordance with the delay line arrangements, block 610 generates leading edge samples, block 620 generates eye center samples, and block 630 generates trailing edge samples.

More particularly, the three latches of block 610 detect a zero crossing of the input signal, indicating the leading edge of a pulse. The three latches of block 630 again detect a zero crossing of the input signal, indicating the trailing edge of the pulse. Once both the leading and trailing edge of the input pulse has been detected, the three latches of block 620 are used to determine how much amplitude is associated with that pulse. The eye center threshold is varied, and multiple experiments are performed to determine the range of values that the pulse can have.

For example, if the threshold is set to 100 mV, then a value of '1' on the middle latches, when the leading and trailing latches indicate that a pulse is present, shows that the pulse was larger than 100 mV in amplitude, while a value of '0' shows that the pulse had less than 100 mV in amplitude. By sweeping the value of the threshold from 100 mV to 300 mV, an accurate measure of the height of a typical pulse can be made. Both leading and trailing edges are determined by looking for a '0' to '1' or '1' to '0' transition between consecutive latches in the leading or trailing group.

Advantageously, in accordance with the inventive principles described herein, channel measurement is taken away from the clock and data recovery (CDR) circuit of a receiver, which is very sensitive to noise and load. That is, an equalizer according to the invention can operate stand-alone, without needing input from the CDR circuit for operation. This way, the equalizer can be matched to many CDR designs. Further, because the snapshot circuit can be operated with a very low duty cycle, the circuit can be kept on continuously, without incurring the power penalty of a circuit that has to be on all the time. The snapshot circuit can also be shut off between clock events, thus saving power and allowing for a continuous update of the equalizer.

It is to be appreciated that while specific circuit embodiments of the methodologies of the invention have been provided and explained above, such inventive methodologies including other processes performed by a communication channel receiver may be implemented, for example, by one or more digital signal processors with associated memory, application specific integrated circuit(s), one or more appropriately programmed general purpose digital computers with associated memory. One of ordinary skill in the art will contemplate various other ways of implementing the invention.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

What is claimed is:

1. A method of equalizing an input signal received from a communications channel, comprising the steps of:
    generating at least one sampling from the received input signal based on a sampling clock signal, the generation of which is not dependent on timing information associated with the communications channel and independent of a clock signal used in a clock and data recovery operation associated with the received input signal; and
    compensating for distortion associated with the communications channel based on at least a portion of the at least one generated sampling, wherein the sampling generation step further comprises the steps of generating multiple phases of the sampling clock signal, wherein the multiple phases are spaced from each other by a fraction of one bit time period, and validating the at least one generated sampling, and wherein the validating step further comprises the steps of:
    generating leading edge samples by sampling the received input signal, via a first plurality of latches, at each of the multiple phases of the sampling clock signal from a first plurality of delay elements;
    generating trailing edge samples by sampling the received input signal, via a second plurality of latches, at each of the multiple phases of the sampling clock signal from a second plurality of delay elements;
    varying an eye center threshold to determine the validity of the at least one generated sampling, wherein the eye center threshold is a value to which an amplitude value of an input pulse is compared; and
    generating eye center samples by sampling the received input signal, via a third plurality of latches, at each of the multiple phases of the sampling clock signal from a third plurality of delay elements, wherein the eye center threshold is an input to each latch of the third plurality of latches.

2. The method of claim 1, wherein the distortion compensating step further comprises the steps of:
    setting one or more parameter values based on the at least a portion of the at least one generated sampling; and
    applying the one or more parameter values to the received input signal.

3. The method of claim 1, wherein the sampling clock signal has a lower frequency than the data recovery clock signal.

4. The method of claim 1, wherein the validating step further comprises discarding samples of the at least one generated sampling that are determined to be invalid.

5. The method of claim 1, wherein the communications channel is a digital communications channel.

6. The method of claim 1, wherein the equalization is performed in accordance with a data receiver coupled to the communications channel.

7. Apparatus for equalizing an input signal received from a communications channel, comprising:

a memory; and at least one processor coupled to the memory and operative to: (i) generate at least one sampling from the received input signal based on a sampling clock signal, the generation of which is not dependent on timing information associated with the communications channel and independent of a clock signal used in a clock and data recovery operation associated with the received input signal; and (ii) compensate for distortion associated with the communications channel based on at least a portion of the at least one generated sampling, wherein the sampling generation operation further comprises generating multiple phases of the sampling clock signal, wherein the multiple phases are spaced from each other by a fraction of one bit time period, and validating the at least one generated sampling, and wherein the validating operation further comprises:

generating leading edge samples by sampling the received input signal, via a first plurality of latches, at each of the multiple phases of the sampling clock signal from a first plurality of delay elements;

generating trailing edge samples by sampling the received input signal, via a second plurality of latches, at each of the multiple phases of the sampling clock signal from a second plurality of delay elements;

varying an eye center threshold to determine the validity of the at least one generated sampling, wherein the eye center threshold is a value to which an amplitude value of an input pulse is compared; and generating eye center samples by sampling the received input signal, via a third plurality of latches, at each of the multiple phases of the sampling clock signal from a third plurality of delay elements, wherein the eye center threshold is an input to each latch of the third plurality of latches.

8. The apparatus of claim 7, wherein the distortion compensating operation further comprises setting one or more parameter values based on the at least a portion of the at least one generated sampling, and applying the one or more parameter values to the received input signal.

9. The apparatus of claim 7, wherein the sampling clock signal has a lower frequency than the data recovery clock signal.

10. The apparatus of claim 7, wherein the validating operation further comprises discarding samples of the at least one generated sampling that are determined to be invalid.

11. The apparatus of claim 7, wherein the communications channel is a digital communications channel.

12. The apparatus of claim 7, wherein the equalization apparatus is associated with a data receiver coupled to the communications channel.

13. An equalization system responsive to an input signal received from a communications channel, comprising:

a sampling module, the sampling module generating at least one sampling from the received input signal based on a sampling clock signal, the generation of which is not dependent on timing information associated with the communications channel and independent of a clock signal used in a clock and data recovery operation associated with the received input signal; and a filter, the filter compensating for distortion associated with the communications channel based on an equalization algorithm which is responsive to at least a portion of the at least one sampling generated by the sampling module, wherein the sampling module generates multiple phases of the sampling clock signal, wherein the multiple phases are spaced from each other by a fraction of one bit time period, and the sampling module validates the at least one generated sampling by:

generating leading edge samples by sampling the received input signal, via a first plurality of latches, at each of the multiple phases of the sampling clock signal from a first plurality of delay elements;

generating trailing edge samples from sampling the received input signal, via a second plurality of latches, at each of the multiple phases of the sampling clock signal from a second plurality of delay elements;

varying an eye center threshold to determine the validity of the at least one generated sampling, wherein the eye center threshold is a value to which an amplitude value of an input pulse is compared; and generating eye center samples by sampling the received input signal, via a third plurality of latches, at each of the multiple phases of the sampling clock signal from a third plurality of delay elements, wherein the eye center threshold is an input to each latch of the third plurality of latches.

14. The equalization system of claim 13, wherein the equalization system is part of a data receiver.

15. The equalization system of claim 14, wherein the equalization system is independent of a clock and data recovery system of the data receiver.

* * * * *